(12) United States Patent
Nakamura et al.

(10) Patent No.: US 8,394,225 B2
(45) Date of Patent: Mar. 12, 2013

(54) METHOD OF MANUFACTURING WIRING SUBSTRATE

(75) Inventors: Tatsuya Nakamura, Nagano (JP);
Tomoko Yamada, Nagano (JP)

(73) Assignee: Shinko Electric Industries Co., Ltd., Nagano-Shi (JP)

(*) Notice: Subject to any disclaimer, the term of this patent is extended or adjusted under 35 U.S.C. 154(b) by 541 days.

(21) Appl. No.: 12/579,726

(22) Filed: Oct. 15, 2009

(65) Prior Publication Data

US 2010/0096078 A1 Apr. 22, 2010

(30) Foreign Application Priority Data

Oct. 16, 2008 (JP) ................................ 2008-267094

(51) Int. Cl.
*B32B 38/10* (2006.01)
(52) U.S. Cl. ........ 156/247; 159/182; 159/189; 159/701; 159/719
(58) Field of Classification Search .................. 156/182, 156/247, 189, 701, 719
See application file for complete search history.

(56) References Cited

U.S. PATENT DOCUMENTS 5,690,837 A 11/1997 Nakaso

2007/0124924 A1* 6/2007 Nakamura .............. 29/830
2007/0130762 A1* 6/2007 Nakamura .............. 29/830

FOREIGN PATENT DOCUMENTS

| JP | 08-316631 | 11/1996 |
| JP | 09-036550 | 2/1997 |
| JP | 11-026938 | 1/1999 |
| JP | 2001-127429 | 5/2001 |
| JP | 2004-273531 | 9/2004 |
| JP | 2007-043201 | 2/2007 |
| JP | 2007-165513 | 6/2007 |

* cited by examiner

*Primary Examiner* — Khanh P Nguyen
*Assistant Examiner* — Margaret Squalls
(74) *Attorney, Agent, or Firm* — Rankin, Hill & Clark LLP

(57) ABSTRACT

Two stacked bodies, each having a metal layer provided on a first metallic foil with carrier via a first insulating layer, are prepared. The first metallic foil with carrier has a metallic foil provided on a carrier plate via a peeling layer. A joined body is formed by jointing the stacked bodies such that the carrier plates are joined via a joining layer. First conductor patterns are formed by patterning the metal layers on both sides of the joined body. Second metallic foils with carrier are provided to the first conductor patterns of the joined body such that the first conductor patterns are opposed to the metallic foils via second insulating layers. Two substrates are formed by peeling the carrier plates with carrier from the peeling layers. Second conductor patterns which are connected electrically to the first conductor patterns are formed from the metallic foils of the substrate.

8 Claims, 14 Drawing Sheets

FIG. 13A
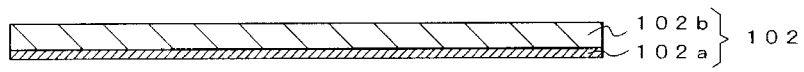
FIG. 13B
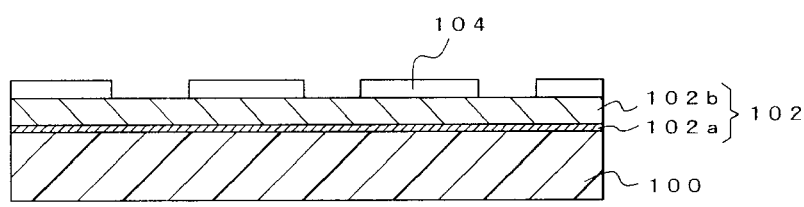
FIG. 13C
FIG. 13D
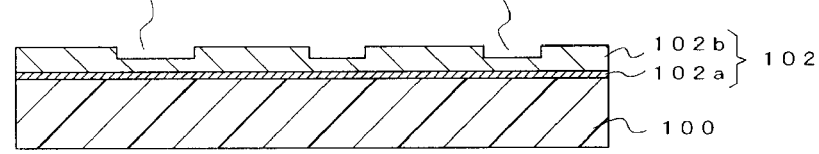
FIG. 13E
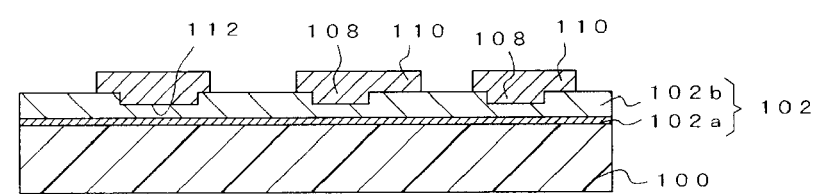
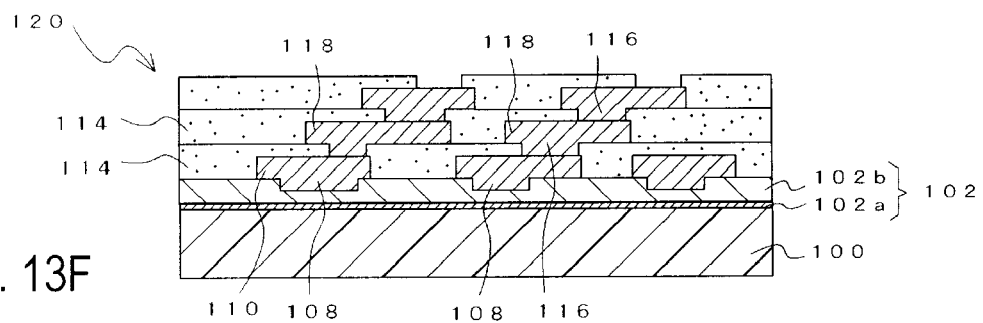
FIG. 13F
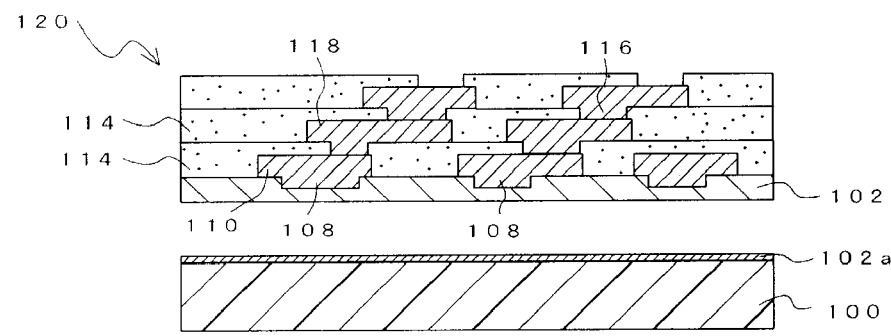

METHOD OF MANUFACTURING WIRING SUBSTRATE

This application claims priority to Japanese Patent Application No. 2008-267094, filed Oct. 16, 2008, in the Japanese Patent Office. The Japanese Patent Application No. 2008-267094 is incorporated by reference in its entirety.

TECHNICAL FIELD

The present disclosure relates to a method of manufacturing a wiring substrate. More specifically, the present disclosure relates to a method of manufacturing a multilayer wiring substrate in which a plurality of conductive patterns are connected electrically via vias, which pass through an insulating layer, and are stacked.

RELATED ART

As the method of manufacturing the multilayer wiring substrate, for example, in following Patent Literature 1, the method of manufacturing the wiring substrate shown in FIGS. 13A to 13F has been proposed.

In the method of manufacturing the wiring substrate shown in FIGS. 13A to 13F, as shown in FIG. 13A, first a peelable metallic foil 102 is stacked on one surface side of a resin plate 100 that is formed of a semi-cured resin as a strong bearing body. In this peelable metallic foil 102, as shown in FIG. 14, a metal plate 102b that is thicker than a metallic foil 102a is joined onto metallic foil 102a via a peeling layer 102c. In stacking the peelable metallic foil 102 on one surface side of the resin plate 100, the peelable metallic foil 102 and the resin plate 100 can be adhered to each other by applying a heating and a pressure bonding in a state that the metallic foil 102a is joined to the resin plate 100.

As shown in FIG. 13B, the metal plate 102b side of the peelable metallic foil 102 stacked on one surface side of the resin plate 100 is covered partially with a dry film 104. Then, bump recesses 106, 106, . . . are formed by applying the etching to the exposed surface of the metal plate 102b, and then the dry film 104 is removed [FIG. 13C].

As shown in FIG. 13D, a bump 108 is formed in the bump recesses 106, 106, . . . by the plating metal respectively, and conductor patterns 110 connected to the bumps 108 respectively are formed. In forming the bumps 108, a metal film 112 made of gold, or the like, which is not etched by an etchant that is used to etch the metal plate 102b as described later, is formed.

Also, as shown in FIG. 13D, not only conductor patterns 118, 118, . . . but also vias 116, 116, . . . passing through insulating layers 114, 114, . . . respectively are formed on the bumps 108 and the conductor patterns 110 by the additive process or the semi-additive process.

In this manner, conductor patterns are stacked in a predetermined number on the metal plate 102b of the peelable metallic foil 102. Thus, since a strength of an obtained wiring substrate 120 is improved, the metal plate 102b of the peelable metallic foil 102 is peeled from the metallic foil 102a, as shown in FIG. 13F.

Then, the metal plate 102b is removed by the etching, and so that the wiring substrate 120 can be obtained.

[Patent Literature 1] JP-A-2007-165513

According to the method of manufacturing the wiring substrate shown in FIGS. 13A to 13F, a strength of the wiring substrate can be maintained by the resin plate 100 as the strong bearing body. Therefore, the multilayer wiring substrate can be manufactured while facilitating the conveyance of the stacked body, etc. in the steps of manufacturing the wiring substrate.

However, in the method of manufacturing the wiring substrate shown in FIGS. 13A to 13F, the metal plate 102b adhered to the wiring substrate 120 that peeled from the resin plate 100 is removed by the etching. In order to shorten an etching time of the metal plate 102b, it is necessary to make the peelable metallic foil 102 thin. However, the peelable metallic foil 102 of predetermined thickness is needed to form the bump recesses 106, 106, . . . in the peelable metallic foil 102. As a result, it is difficult to shorten a time required to etch the peelable metallic foil 102.

SUMMARY

Exemplary embodiments of the present invention provide a method of manufacturing a wiring substrate that is not needed to remove a metallic foil by an etching.

The inventors of the present invention arrived at the present invention as a result of the study made based on a consideration such that it is advantageous to solve the above problems that conductive patterns should be formed by using a metallic foil with carrier, in which a metallic foil is stacked on one surface side of a carrier plate as a supporting body via a release layer.

A method of manufacturing a wiring substrate according to a first aspect of the present invention, comprises:

preparing two stacked bodies, each having a first metallic foil with carrier, a first insulating layer and a metal layer, the first metallic foil with carrier having a carrier plate, a peeling layer and a metallic foil provided on one surface side of the carrier plate via the peeling layer, the metal layer being thicker than the metallic foil of the first metallic foil with carrier and being provided on a metallic foil side of the first metallic foil with carrier via the first insulating layer;

forming a joined body by jointing the two stacked bodies such that the carrier plates are joined via a joining layer;

forming first conductor patterns by patterning the metal layers positioned on both sides of the joined body respectively;

providing second metallic foils with carrier, each of which has a carrier plate, a peeling layer and a metallic foil provided on one surface side of the carrier plate via the peeling layer, to the first conductor patterns formed in the both sides of the joined body respectively via second insulating layers such that the first conductor patterns are opposed to the metallic foils of the second metallic foils via the second insulating layers;

forming two substrates, each of which has the metallic foils of the first and second metallic foils with carrier on both surface sides of the first conductor patterns via the first and second insulating films, by peeling the carrier plates of the first and second metallic foils with carrier from the peeling layers of the first and second metallic foils with carrier; and forming second conductor patterns which are connected electrically to the first conductor patterns via vias that pass through the first and second insulating layers respectively, from the metallic foils formed on both surface sides of the substrate.

A method of manufacturing a wiring substrate according to a second aspect of the present invention, comprising:

preparing two stacked bodies, each of which has two first metallic foils with carrier and a first insulating layer, each of the first metallic foils with carrier having a carrier plate, a peeling layer and a metallic foil provided on one surface side of the carrier plate via the peeling layer, the two first metallic foils with carrier being stacked with each other such that the respective metallic foils of the first metallic foils with carrier are opposed to each other via the first insulating layer;

forming a joined body by joining two stacked bodies such that the carrier plates on one surface side of the stacked bodies are joined via a joining layer;

forming first conductor patterns which are connected electrically to the metallic foils of the first metallic foils with carrier via vias that pass through the first insulating layers in the joined body respectively, from the respective metallic foils that are exposed by peeling the carrier plates provided on both sides of the joined body respectively;

providing second metallic foils with carrier, each of which has a carrier plate, a peeling layer and a metallic foil provided on one surface side of the carrier plate via the peeling layer, to the first conductor patterns via second insulating layers such that the first conductor patterns are opposed to the metallic foils of the second metallic foils with carrier respectively;

forming two substrates, each of which has the metallic foils of the first and second metallic foils with carrier on both surface sides of the first conductor patterns via the first and second insulating films, by peeling the carrier plates of the first and second metallic foils with carrier from the peeling layers of the first and second metallic foils with carrier; and forming second conductor patterns, which are connected electrically to the first conductor patterns via vias that pass through the first and second insulating layers respectively, from the metallic foils formed on both surface sides of the substrate.

In a method of manufacturing a wiring substrate according to the first or second aspect of the present invention, the method may further comprises:

stacking sequentially a plurality of conductor patterns, which are connected electrically via vias that pass through third insulating layers, on the both surface sides of the substrate that contains the first conductor patterns therein to form the wiring substrate, in which the conductor patterns are formed as an odd-numbered layer.

A method of manufacturing a wiring substrate according to a fourth aspect of the present invention, comprises:

preparing two stacked bodies, each of which has two first metallic foils with carrier and a first insulating layer, each of the first metallic foils with carrier having a carrier plate, a peeling layer and a metallic foil provided on one surface side of the carrier plate via the peeling layer, the two first metallic foils with carrier being stacked with each other such that the respective metallic foils of the first metallic foils with carrier are opposed to each other via the first insulating layer;

forming a joined body by joining two stacked bodies such that the carrier plates on one surface side of the stacked bodies are joined via a joining layer;

forming first conductor patterns which are connected electrically to the metallic foils of the first metallic foils with carrier via vias that pass through the first insulating layers in the joined body respectively, from the respective metallic foils that are exposed by peeling the carrier plates provided on both sides of the joined body respectively;

providing second metallic foils with carrier, each of which has a carrier plate, a peeling layer and a metallic foil provided on one surface side of the carrier plate via the peeling layer, to the first conductor patterns via second insulating layer such that the first conductor patterns are opposed to the metallic foils of the second metallic foils with carrier respectively;

forming second conductor patterns, which are connected electrically to the first conductor patterns via vias that pass through the second insulating layers, from the metallic foils that are exposed by peeling the carrier plates of the second metallic foils with carrier;

providing third metallic foils with carrier, each of which has a carrier plate, a peeling layer and a metallic foil provided on one surface side of the carrier plate via the peeling layer, to the second conductor patterns via third insulating layers such that the second conductor patterns are opposed to the metallic foils of the third metallic foils with carrier; and forming two substrates, which has the metallic foils of the first and third metallic foils with carrier to put the first conductor patterns and the second conductor patterns therebetween, by peeling the carrier plates of the first and third metallic foils with carrier.

In a method of manufacturing a wiring substrate according to the fourth aspect of the present invention, the method may further comprises:

stacking sequentially a plurality of conductor patterns, which are connected electrically via vias that pass through fourth insulating layers, on both surface sides of the substrate that contains therein the first conductor patterns and the second conductor patterns that are connected electrically via the vias that pass through the second insulating layers to form the wiring substrate, in which conductor patterns are formed as an even-numbered layer.

In a method of manufacturing a wiring substrate according to the first, second or fourth aspect of the present invention, the metallic foil of each of the first and second metallic foils with carrier may be a copper foil, and the carrier plate may be a copper plate.

In a method of manufacturing a wiring substrate according to the first, second or fourth aspect of the present invention, the method may further comprises:

forming the vias by forming via holes in the first or second insulating layer by a laser and then filling the via holes with a plating metal.

According to the method of manufacturing the wiring substrate according to the present invention, the step of removing the metallic plate by the etching, which is needed in the method of manufacturing the wiring substrate in the prior art shown in FIGS. 13A to 13F, can be omitted. Therefore, the steps of manufacturing the wiring substrate can be shortened.

Also, in the preset invention, the carrier plate of the metallic foil with carrier is employed as the strong bearing body. As a result, a strength of the stacked body can be maintained during the manufacturing step, and the trouble caused due to the deformation of the stacked body by the roller, or the like during the manufacturing step can be prevented.

Other features and advantages may be apparent from the following detailed description, the accompanying drawings and the claims.

BRIEF DESCRIPTION OF THE DRAWINGS

FIGS. 13A to 13F show process drawings explaining a method of manufacturing a wiring substrate in a related art.

DETAILED DESCRIPTION

Figure 1A:
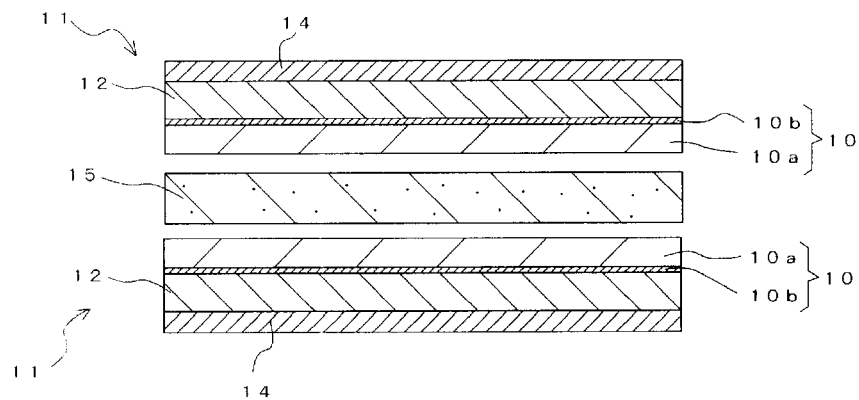
FIGS. 1A to 1D show process drawings explaining an exemplary embodiment of a method of manufacturing a wiring substrate according to the present invention.

An exemplary embodiment of a method of manufacturing the wiring substrate according to the present invention is shown in FIG. 1A to FIG. 3E hereunder. First, as shown in FIG. 1A, a stacked body 11 is formed by stacking a copper foil 14, which is formed of a metal layer thicker than a metallic foil 10b (i.e., first metallic foil), on the metallic foil 10b side of a metallic foil with carrier 10 (i.e., first carrier) via an insulating layer 12 made of a resin. As this copper foil 14, a copper foil of 18 μm thick is employed.

In stacking the copper foil 14 on the metallic foil with carrier 10, the heating and the press bonding can be applied while using a sheet, which is formed of a thermosetting resin in a semi-cured state, as the insulating layer 12.

Figure 4:
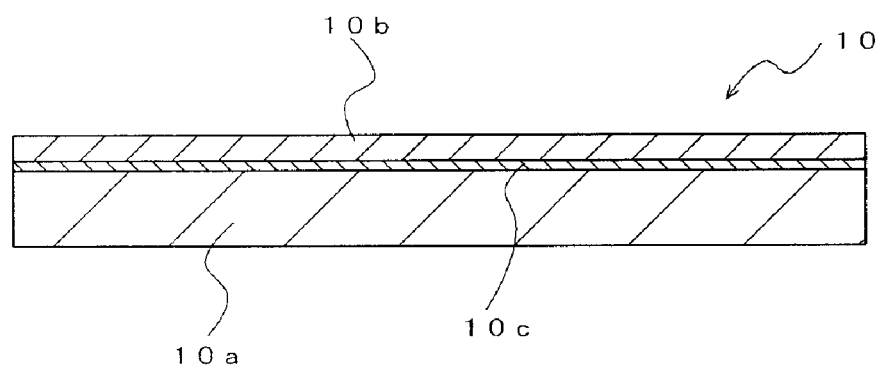
FIG. 4 shows a partial cross sectional view explaining a metallic foil with carrier used in the method of manufacturing a wiring substrate shown in FIGS. 1A-3E.

Also, as shown in FIG. 4, in the metallic foil with carrier 10 (i.e., first carrier), the metallic foil 10b (i.e., first metallic foil) is provided on one surface side of a carrier plate 10a (i.e., first carrier plate) as the strong bearing body via a peeling layer 10c (i.e., first peeling layer). A copper plate of 15 to 70 μm thick can be employed as the carrier plate 10a, and a copper foil of 0.5 to 12 μm thick can be employed as the metallic foil 10b.

Figure 1B:
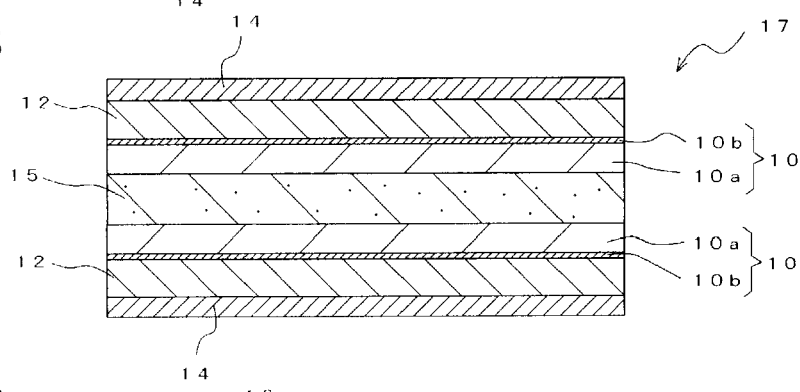

Two stacked bodies 11, 11 shown in FIG. 1A are stacked by joining the carrier plates 10a, 10a via a joining layer 15. Thus, a joined body 17 shown in FIG. 1B is formed. The joining layer 15 is a sheet that is formed of a thermosetting resin in a semi-cured state, and can be heated and pressure-bonded. Both surfaces of the joined body 17 are formed of the copper foil 14 respectively.

Figure 1C:
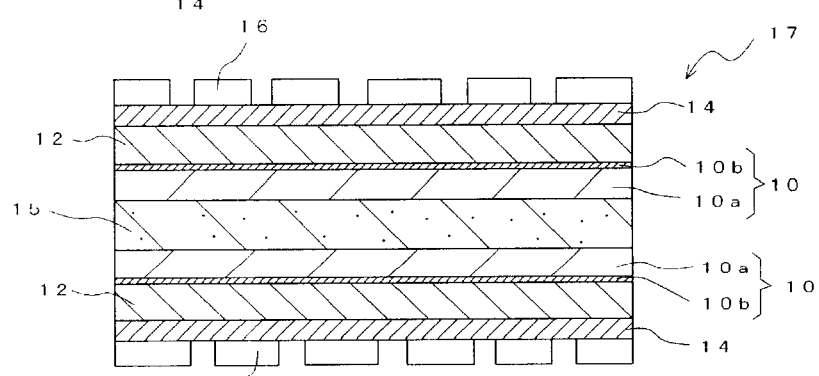

As shown in FIG. 1C, exposed surfaces of the copper foils 14, 14 are covered partially with dry films 16, 16.

Figure 1D:
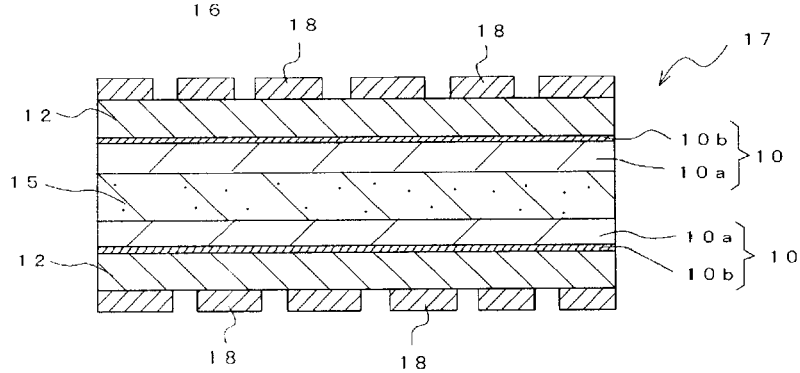

The dry films 16, 16 are peeled by etching the portions where the surface of the copper foil 14 is exposed partially respectively. Thus, as shown in FIG. 1D, first conductor patterns 18, 18, . . . can be formed on both surfaces of the joined body 17. The first conductor patterns 18, 18, . . . can be employed preferably for a power feed or ground since these patterns are formed in the center portion of the wiring substrate, as described later.

Figure 2A:
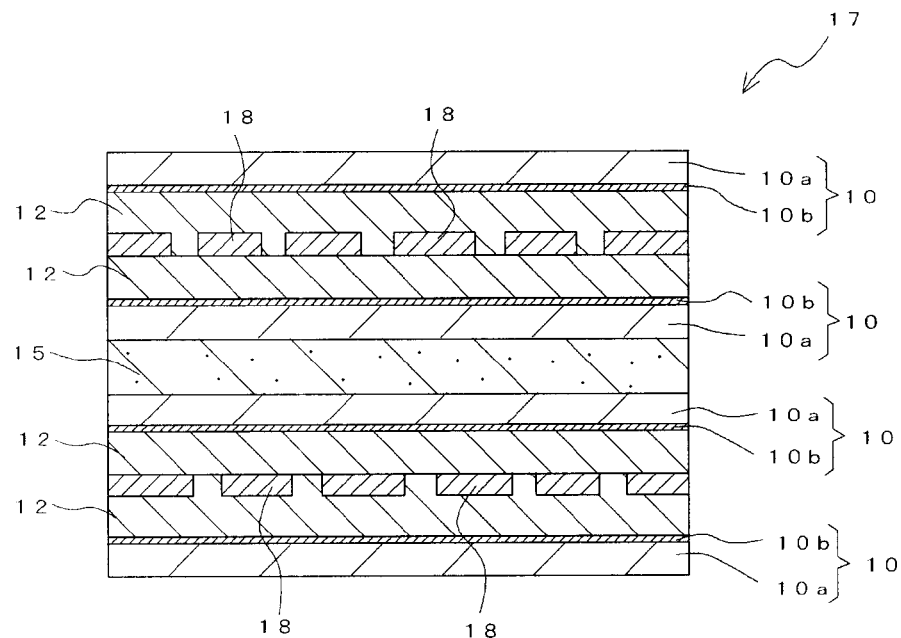
FIGS. 2A to 2B show process drawings explaining steps following the process drawing shown in FIG. 1D.

Also, as shown in FIG. 2A, the metallic foil with carrier 10 (i.e., second carrier) is provided on both surface sides of the joined body 17, on which the first conductor patterns 18, 18, . . . are formed as shown in FIG. 1D, via the insulating layer 12 respectively. The metallic foil with carrier 10 is provided such that the metallic foil 10b (i.e., second metallic foil) is opposed to the first conductor patterns 18, 18, . . . . In this case, a sheet formed of a thermosetting resin in a semi-cured state is employed as the insulating layer 12, and the heating and the pressure-bonding are applied.

In the joined body 17 obtained in this manner and shown in FIG. 2A, four metallic foils with carrier 10 are provided.

Figure 2B:
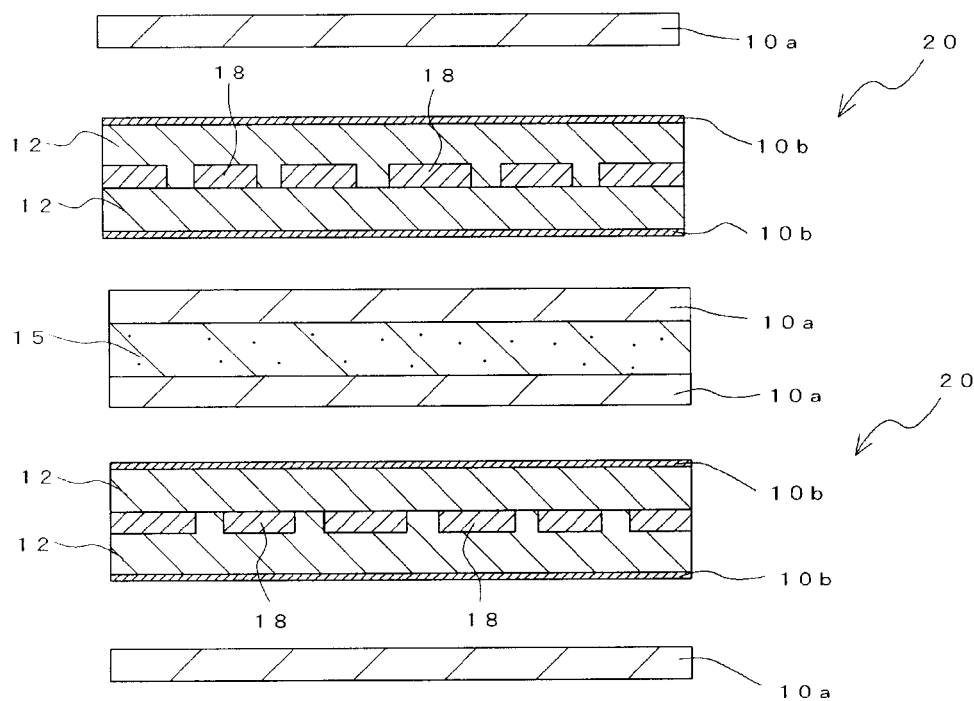

Then, as shown in FIG. 2B, the carrier plates 10a of the metallic foils with carrier 10, 10, 10 in the joined body 17 are peeled from the metallic foil 10b respectively. Thus, two substrates 20, 20 in which the first conductor patterns 18, 18, . . . are formed in the center portion can be obtained. In the substrate 20, the insulating layers 12, 12 that are covered with the metallic foil 10b respectively are formed on both surface sides of the first conductor patterns 18, 18, . . . formed in the center portion. Therefore, the substrate 20 can be easily carried.

In procedures shown in FIGS. 3A to 3E, conductor patterns that are connected by the first conductor patterns 18, 18, . . . formed in the center portion and vias are formed on the substrates 20, 20 respectively, and thus the wiring substrate can be obtained. In FIGS. 3A to 3E, steps of manufacturing the wiring substrate employing one of the substrates 20, 20 is illustrated.

Figure 3A:
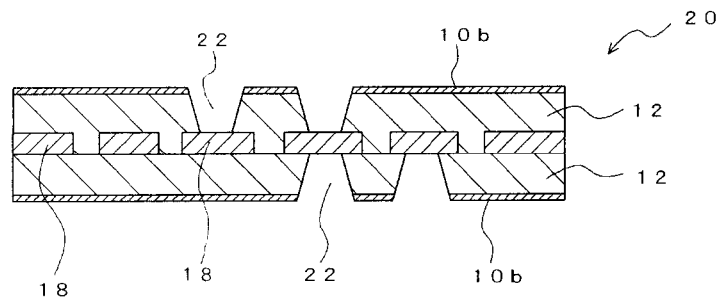
FIGS. 3A to 3E show process drawings explaining steps following the process drawing shown in FIG. 2B.

First, as shown in FIG. 3A, in the substrate 20, via holes 22, 22, from bottom surfaces of which the first conductor pattern 18 is exposed respectively, are formed in predetermined positions of the metallic foil 10b by the laser. Since this via hole 22 is formed by the laser, the via hole 22 is formed like a taper shape whose inner diameter is reduced gradually toward the bottom surface from the opening portion. In this case, the residues produced in forming the via holes 22, 22, . . . by the laser are removed by applying the desmear process to the substrate 20.

Figure 3B:
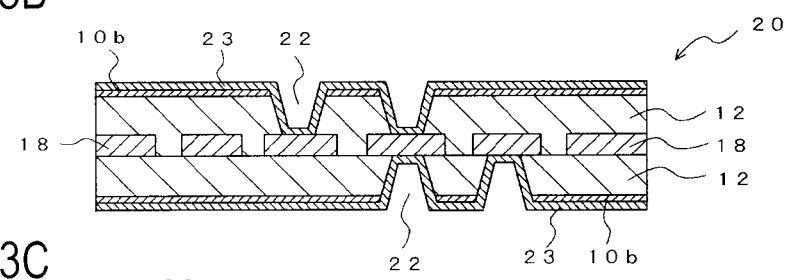

As shown in FIG. 3B, a thin metal film 23 is formed on the whole surface of the substrate 20 containing inner wall surfaces of the via holes 22, 22, . . . on both sides by the electroless plating or the vapor deposition.

Figure 3C:
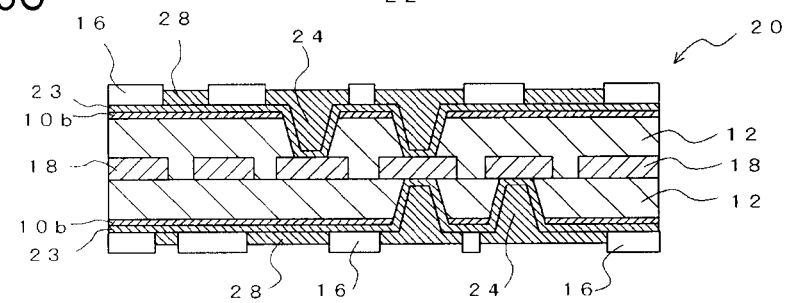

Also, shown in FIG. 3C, the dry films 16, 16 are patterned, and then the electroplating is applied by using the metallic foil 10b and the thin metal film 23 as a power feeding layer. Thus, vias 24, 24 that are formed by filling a plating metal in the via holes 22, 22, . . . , and second conductor patterns 28, 28 . . . that are connected electrically to the first conductor pattern 18 via the via 24 respectively can be formed on both surface sides of the substrate 20.

Figure 3D:
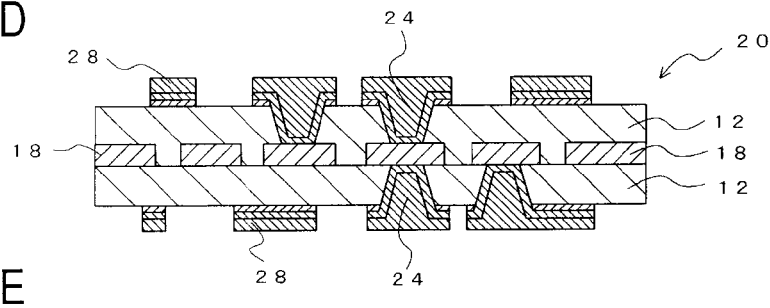

Then, as shown in FIG. 3D, the metallic foil 10b and the thin metal film 23 being exposed by peeling the dry films 16, 16 are etched. Thus, as shown in FIG. 3D, the second conductor patterns 28, 28 . . . connected electrically to the first conductor pattern 18 via the via 24 respectively can be formed on both surface sides of the substrate 20.

Figure 3E:
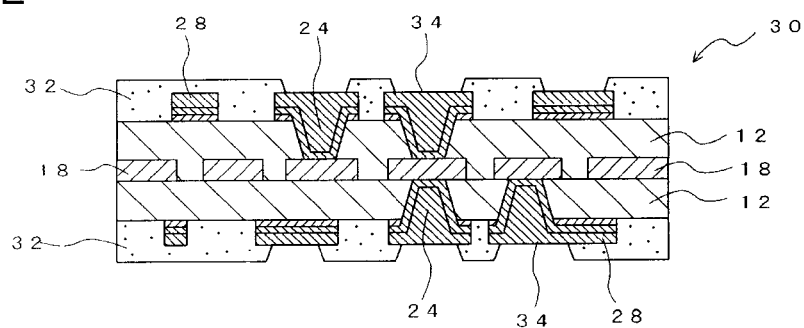

Then, as shown in FIG. 3E, the second conductor patterns 28, 28 . . . are covered with a solder resist 32 except the areas where pads 34 are formed. Accordingly, a wiring substrate 30 can be obtained.

In this manner, in the method of manufacturing the wiring substrate shown in FIG. 1A to FIG. 3E, the carrier plate 10a of the metallic foil with carrier 10 acts as the strong bearing body in the joined body 17. Therefore, the conveyance of the joined body 17 can be handled without any trouble.

Also, like the method of manufacturing the wiring substrate shown in FIGS. 13A to 13F, the step of removing the metal plate 102b by the etching can be omitted, and the shortening of the steps of manufacturing the wiring substrate 30 can be attained.

In the method of manufacturing the wiring substrate shown in FIG. 1A to FIG. 3E, as shown in FIG. 3A, in such a situation that the via holes 22, 22, . . . must be formed on the first conductor patterns 18 from both surface sides by the laser, when the via holes 22 are formed from the other surface side of the first conductor patterns 18 by the laser in a condition that the first conductor patterns 18 are exposed from the bottom surfaces of the via holes 22 formed from one surface side of the first conductor patterns 18 by the laser, it is feared that the first conductor patterns 18 exposed from bottom surfaces of the via holes 22 that have already been formed from the one surface side of the first conductor patterns 18 are destroyed.

In this respect, according to a method of manufacturing the wiring substrate shown in FIG. 5A to FIG. 9D, it is possible to overcome such a fear that the first conductor patterns 18 are destroyed when the via holes 22 are formed in the substrate 20 by the laser.

Figure 5A:
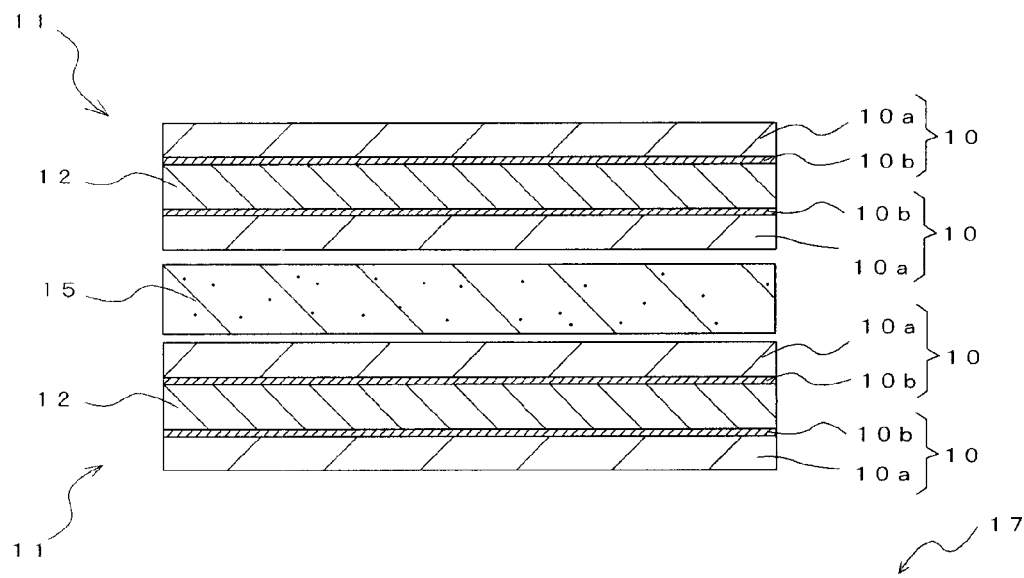
FIGS. 5A to 5C show process drawings explaining another exemplary embodiment of a method of manufacturing a wiring substrate according to the present invention.

First, as shown in FIG. 5A, two stacked bodies 11 are formed by joining two metallic foils with carrier 10, 10 such that the metallic foils 10*b*, 10*b* are opposed to each other via the insulating layer 12 formed of a resin. This joining can be executed by applying the heating and the press bonding while putting a sheet formed of a thermosetting resin in a semi-cured state as the insulating layer 12 between the metallic foils with carrier 10, 10.

Figure 5B:
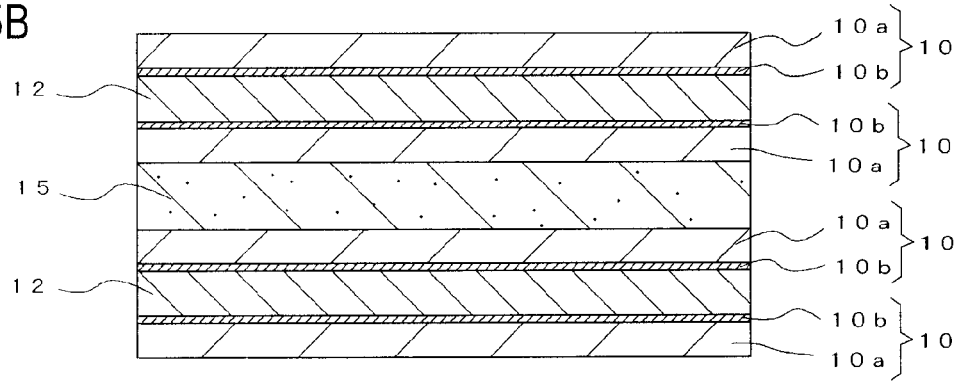

Also, the joined body 17 shown in FIG. 5B is formed by joining two stacked bodies 11 via the joining layer 15. This joining by using the joining layer 15 can be executed by applying the heating and the press bonding while putting a sheet formed of a thermosetting resin in a semi-cured state as the joining layer 15 between the stacked bodies 11, 11.

Figure 5C:
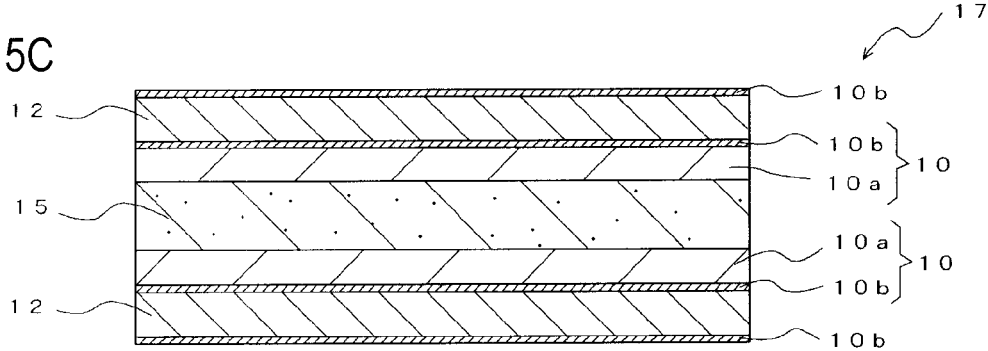

Then, the carrier plates 10*a* of the metallic foils with carrier 10, 10 are peeled from both surface sides of the joined body 17 obtained in this manner. Thus, as shown in FIG. 5C, the joined body 17 from both surface sides of which the metallic foils 10*b*, 10*b* are exposed is obtained.

Figure 6A:
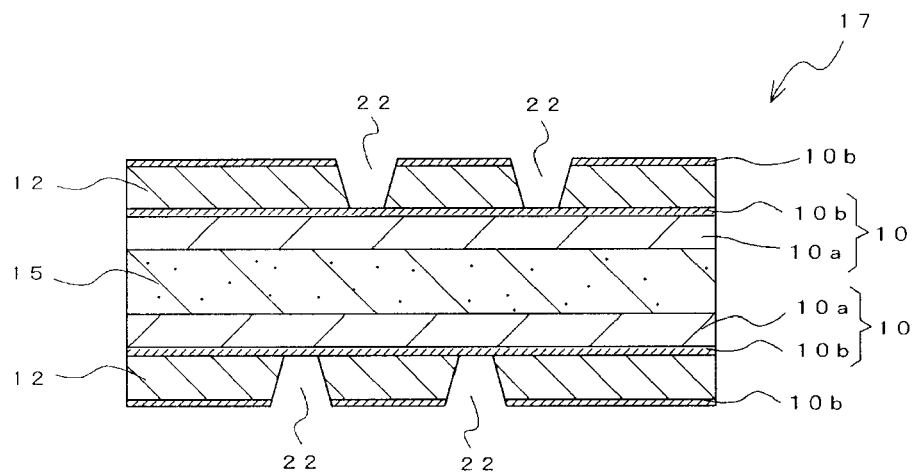
FIGS. 6A to 6C show process drawings explaining steps following the process drawing shown in FIG. 5C.

In the joined body 17 from both surface sides of which the metallic foils 10*b*, 10*b* are exposed, as shown in FIG. 6A, the via holes 22, 22, . . . from the bottom surfaces of which the metallic foil 10*b* of other metallic foil with carrier 10 is exposed respectively are formed on both surfaces of the joined body 17 at predetermined locations of the metallic foils 10*b*, 10*b* by the laser. Since this via hole 22 is formed by the laser, the via hole 22 is formed like a taper shape whose inner diameter is reduced gradually toward the bottom surface from the opening portion. The residues produced in forming the via holes 22, 22, . . . by the laser are removed by applying the desmear process to the substrate 20.

Figure 6B:
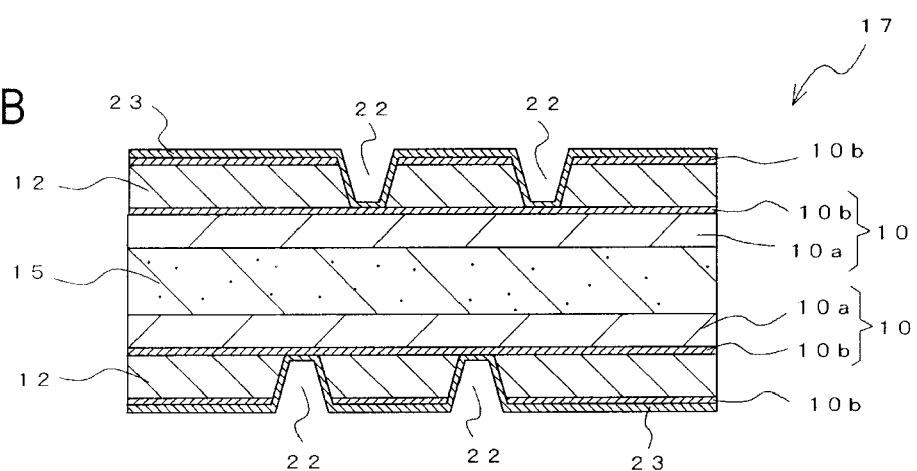

As shown in FIG. 6B, the thin metal film 23 is formed on the whole surface on one surface side of the insulating layers 12, 12, . . . containing inner wall surfaces of the via holes 22, 22, . . . by the electroless plating or the vapor deposition.

Figure 6C:
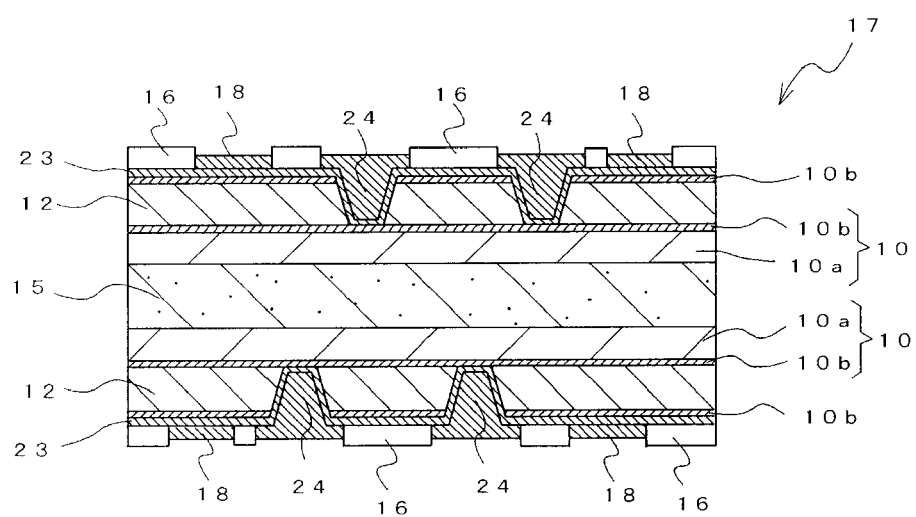

Also, shown in FIG. 6C, the dry films 16, 16 are patterned, and then the via-fill electroplating is applied by using the metallic foil 10*b* and the thin metal film 23 as a power feeding layer. Thus, vias 24, 24 that are formed by filling a plating metal in the via holes 22, 22, . . . , and the first conductor patterns 18, 18 are formed on both surface sides of the joined body 17.

Figure 7A:
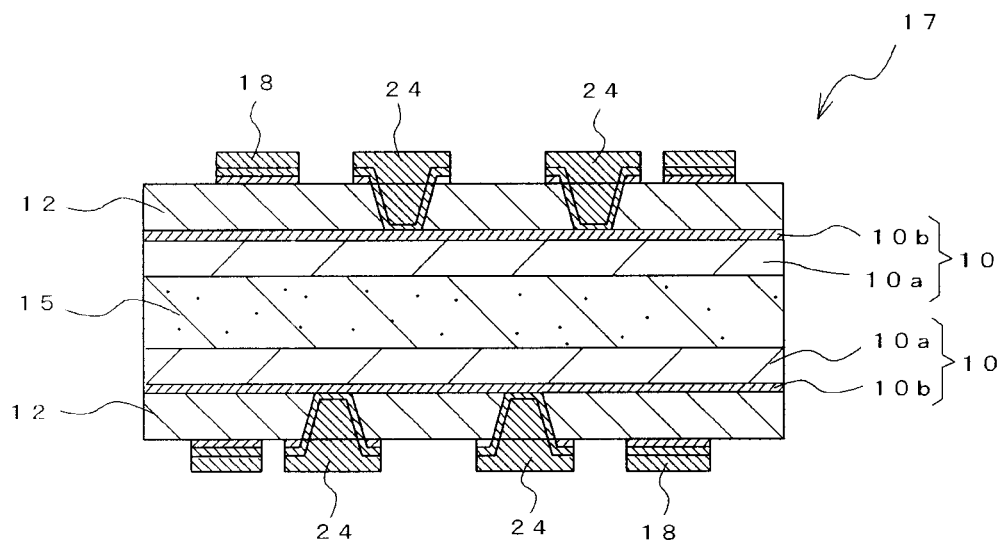
FIGS. 7A to 7B show process drawings explaining steps following the process drawing shown in FIG. 6C.

The dry films 16, 16 are peeled, and then the metallic foil 10*b* and the thin metal film 23 being exposed are etched. Thus, as shown in FIG. 7A, the first conductor patterns 18, 18, . . . and the via holes 22, 22, . . . can be formed on both surface sides of the joined body 17.

Figure 7B:
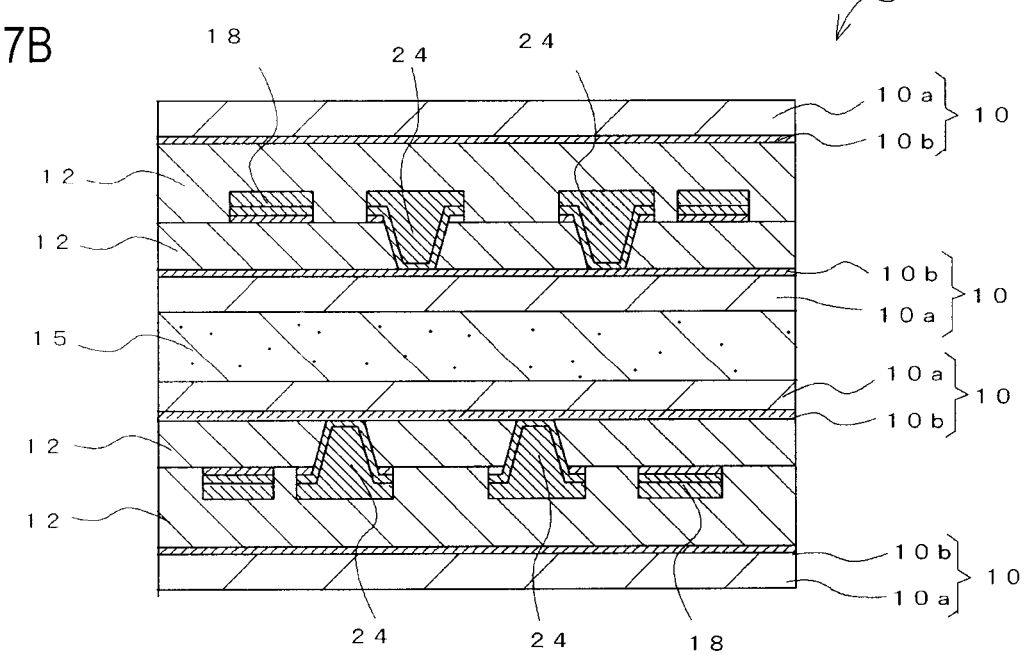

The metallic foil with carrier 10 is provided on both surface sides of the joined body 17, on both surface sides of which the first conductor patterns 18, 18, . . . and the via holes 22, 22, . . . are formed, via the insulating layer 12 respectively such that the metallic foil with carrier 10 is opposed to the first conductor patterns 18, 18, . . . [FIG. 7B].

In the joined body 17 obtained in this manner and shown in FIG. 7B, four metallic foils with carrier 10, 10, 10 are provided.

Figure 8:
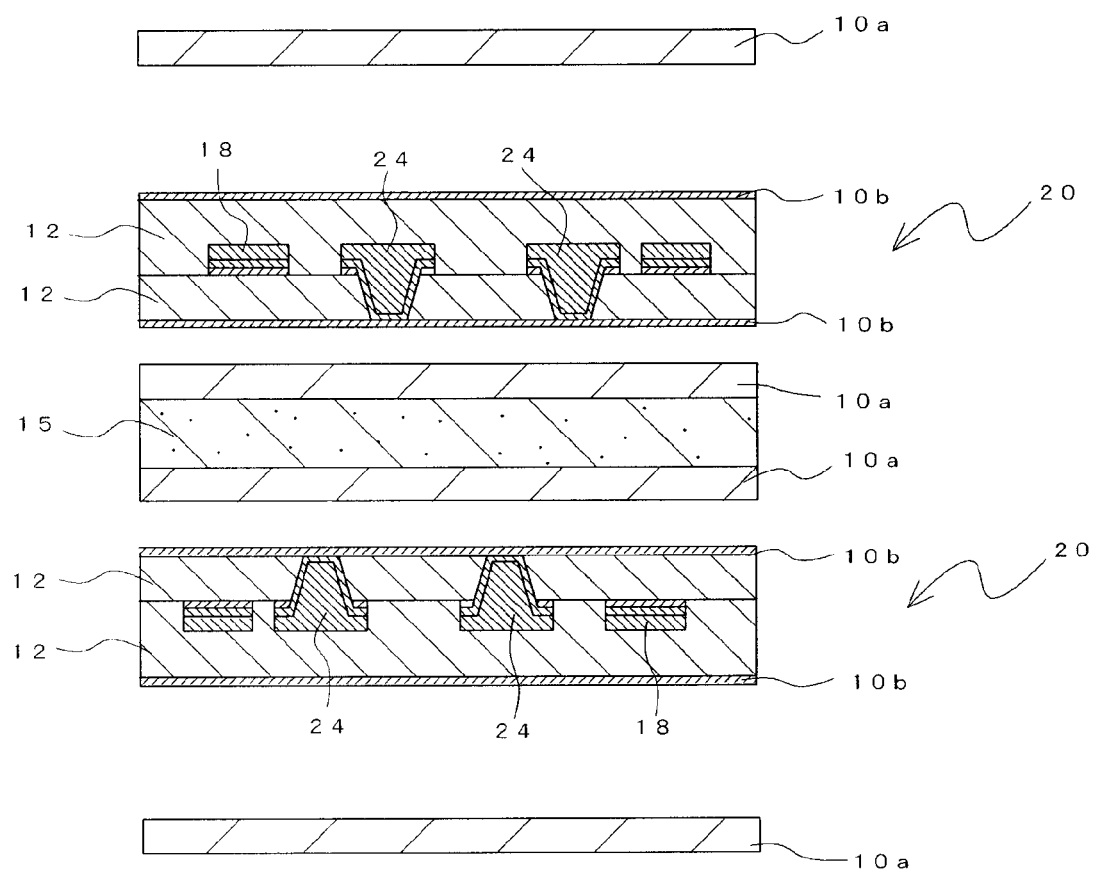
FIG. 8 shows a process drawing explaining steps following the process drawing shown in FIG. 7B.

Then, as shown in FIG. 8, respective carrier plates 10*a* of the metallic foils with carrier 10, 10, 10 in the joined body 17 are peeled from the metallic foil 10*b* respectively. Thus, the substrates 20, 20 in which the insulating layer 12 being covered with the metallic foil 10*b* is formed on both surface sides of the first conductor patterns 18, 18, . . . formed in the center portion respectively can be obtained. The via 24 that passes through one side of the insulating layers 12, 12 is formed at the locations of the first conductor patterns 18, 18, . . . respectively.

In this substrate 20, the insulating layers 12, 12 are formed on both surface sides of the first conductor patterns 18, 18, . . . formed in the center portion. Therefore, the conveyance of the substrate 20 can be easily carried out.

In procedures shown in FIGS. 9A to 9D, the conductor patterns that are connected by the first conductor patterns 18, 18, . . . formed in the center portion and vias are formed on the substrates 20, 20 respectively, and thus the wiring substrate can be obtained. In FIGS. 9A to 9D, the steps of manufacturing the wiring substrate using one of substrates 20 are illustrated.

Figure 9A:
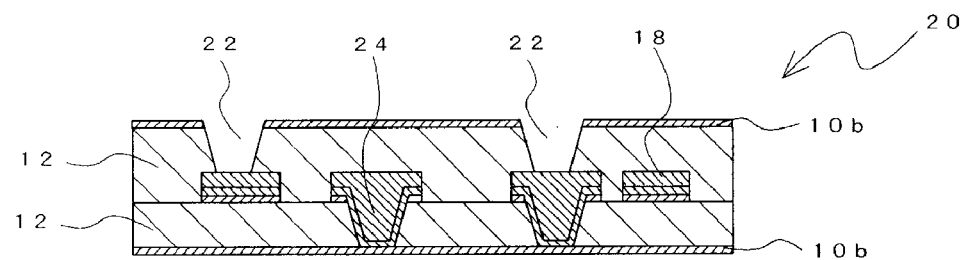
FIGS. 9A to 9D show process drawings explaining steps following the process drawing shown in FIG. 8.

First, as shown in FIG. 9A, the via holes 22, 22, from bottom surfaces of which the first conductor pattern 18 or the via 24 is exposed respectively, are formed in predetermined positions of the metallic foil 10*b* on the first conductor patterns 18, 18 side of the substrate 20 by the laser. At this time, since the insulating layer 12 or the via 24 is formed on the other surface side of the first conductor patterns 18, the situation that the first conductor patterns 18 are destroyed by an impact caused by the laser can be prevented even when the laser is irradiated onto one surface side of the first conductor patterns 18 exposed from the bottom surfaces of the via holes 22.

Figure 9B:
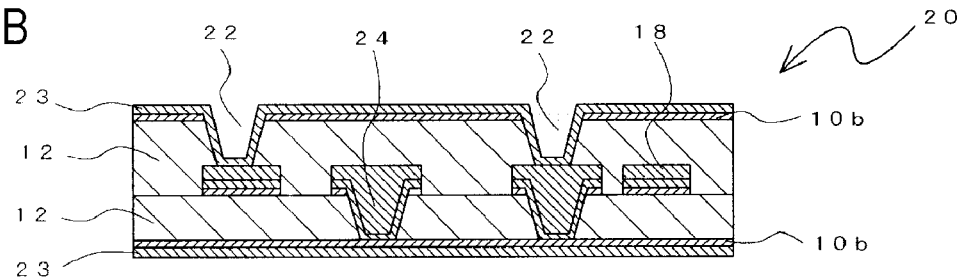

Then, as shown in FIG. 9B, the thin metal film 23 is formed on both surfaces of the substrate 20, from which the metallic foils 10*b*, 10*b* are exposed, by the electroless plating or the vapor deposition. Also, the thin metal film 23 is formed on the inner wall surfaces of the via holes 22, 22 . . . .

Figure 9C:
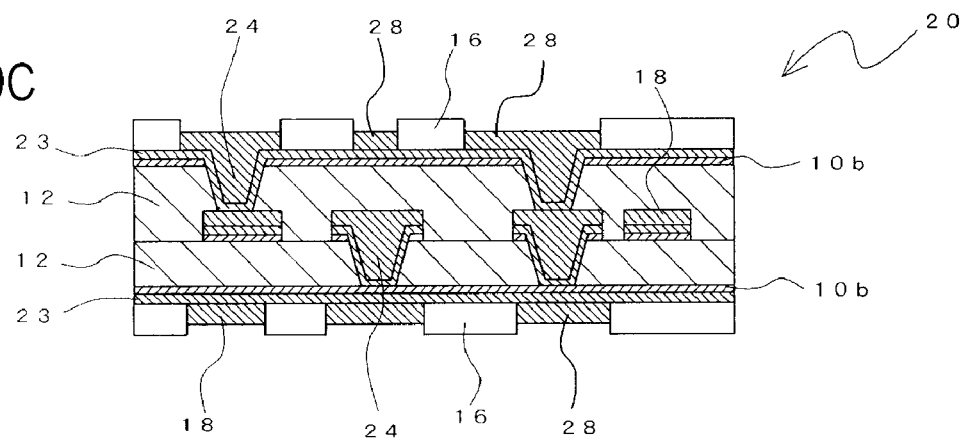

Then, as shown in FIG. 9C, the dry films 16, 16 are patterned, and then the via-fill electroplating is applied by using the metallic foil 10*b* and the thin metal film 23 as a power feeding layer. Thus, vias 24, 24 that are formed by filling the plating metal in the via holes 22, 22, . . . , and the second conductor patterns 28, 28 are formed on both surface sides of the substrate 20.

Then, the metallic foil 10*b* and the thin metal film 23 exposed by peeling the dry films 16, 16 are etches. Thus, the second conductor patterns 28, 28 . . . that are connected electrically to the first conductor pattern 18 via the via 24 respectively can be formed on both surface sides of the substrate 20.

Figure 9D:
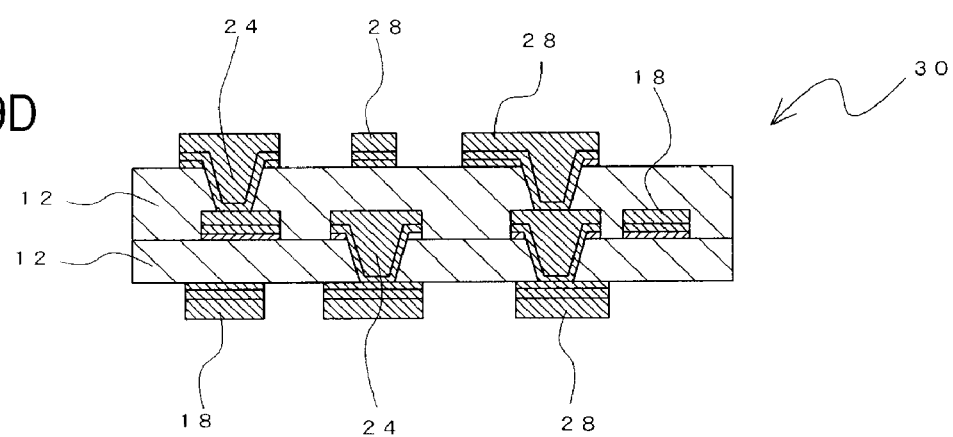

Then, the second conductor patterns 28, 28 . . . are covered with the solder resist 32 except the areas where pads 34 are formed (See FIG. 3E). Accordingly, as shown in FIG. 9D, the wiring substrate 30 can be obtained.

In the method of manufacturing the wiring substrate shown in FIG. 1A to FIG. 9D, the wiring substrate in which three-layered conductor patterns are stacked is manufactured. In this case, when the multilayer wiring substrate is manufactured further, the conductor patterns are formed simultaneously on both surface sides of the substrate 20 by the publicly known additive process or the additive process to prevent generation of warp, or the like of the substrate 20.

In this manner, in the method of manufacturing the wiring substrate shown in FIG. 1A to FIG. 9D, the wiring substrate in which the conductor patterns are stacked as odd-numbered layers can be obtained.

Also, the wiring substrate in which the conductor patterns are stacked in the odd number can be obtained by peeling respective carrier plates 10a of the metallic foils with carrier 10, 10 provided on both surface sides of the joined body 17 shown in FIG. 7B.

In contrast to the method of manufacturing the wiring substrate shown in FIG. 1A to FIG. 9D, according to the manufacturing method shown in FIG. 10A to FIG. 12, the wiring substrate in which the conductor patterns are stacked as even-numbered layers can be obtained.

Figure 10A:
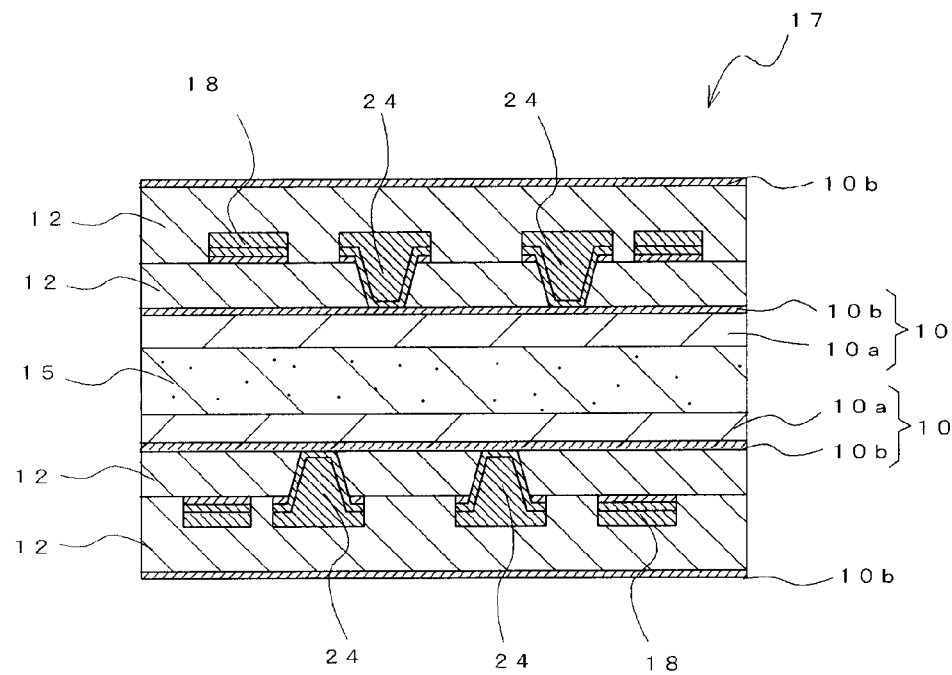
FIGS. 10A to 10B show process drawings explaining further another exemplary embodiment of a method of manufacturing a wiring substrate according to the present invention.

First, the carrier plate 10a of the metallic foil with carrier 10 provided on both surface sides of the joined body 17 shown in FIG. 7B is peeled respectively. Thus, as shown in FIG. 10A, the metallic foil 10b is exposed on both surface sides of the joined body 17 respectively.

Figure 10B:
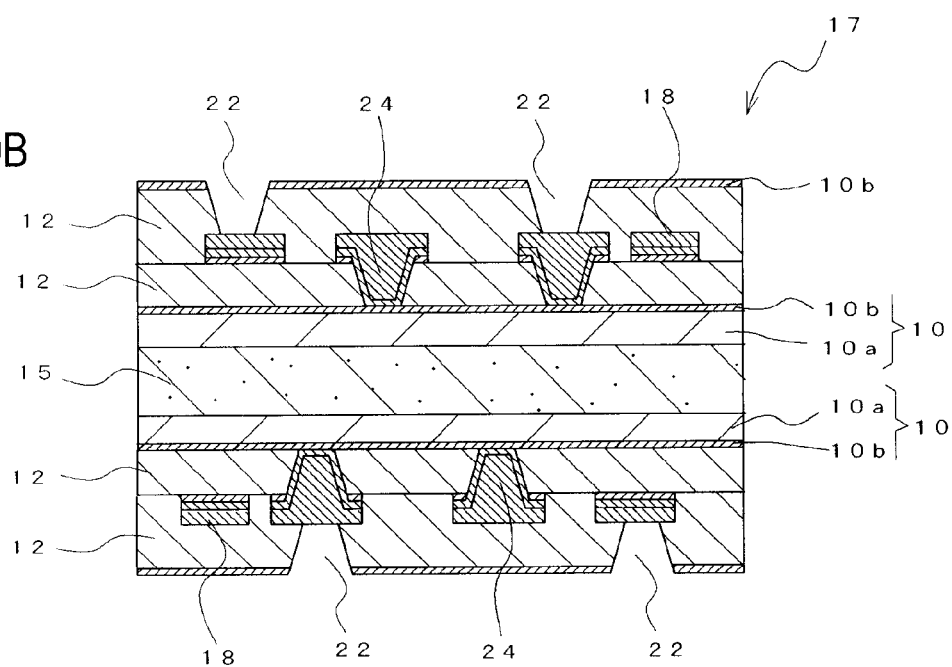

Then, as shown in FIG. 10B, the via holes 22, 22, ..., from bottom surfaces of which the first conductor pattern 18 or the via 24 is exposed respectively, are formed in predetermined positions of the metallic foil 10b exposed on both sides of the joined body 17 by the laser.

The thin metal film 23 is formed on the whole surface on both surfaces of the joined body 17, in which the via holes 22, 22, ... are formed, on the insulating layer 12 side by the electroless plating or the vapor deposition. Also, the thin metal film 23 is formed on the inner wall surfaces of the via holes 22, 22 ....

Then, the dry films 16, 16 provided on the thin metal film 23 respectively are patterned, and then the via-fill electroplating is applied by using the metallic foil 10b and the thin metal film 23 as a power feeding layer. Thus, vias 24, 24, ... are formed by filling the plating metal in the via holes 22, 22, ..., and also second conductor patterns 36, 36 are formed [FIG. 11A].

Then, the dry films 16, 16 are peeled, and then the metallic foil 10b and the thin metal film 23 being exposed on both surface sides of the joined body 17 are etched. Thus, the second conductor patterns 28, 28 each connected electrically to the first conductor pattern 18 via the via 24 are formed, and then the insulating layer 12 is formed on both surface sides of the joined body 17 respectively.

Figure 11A:
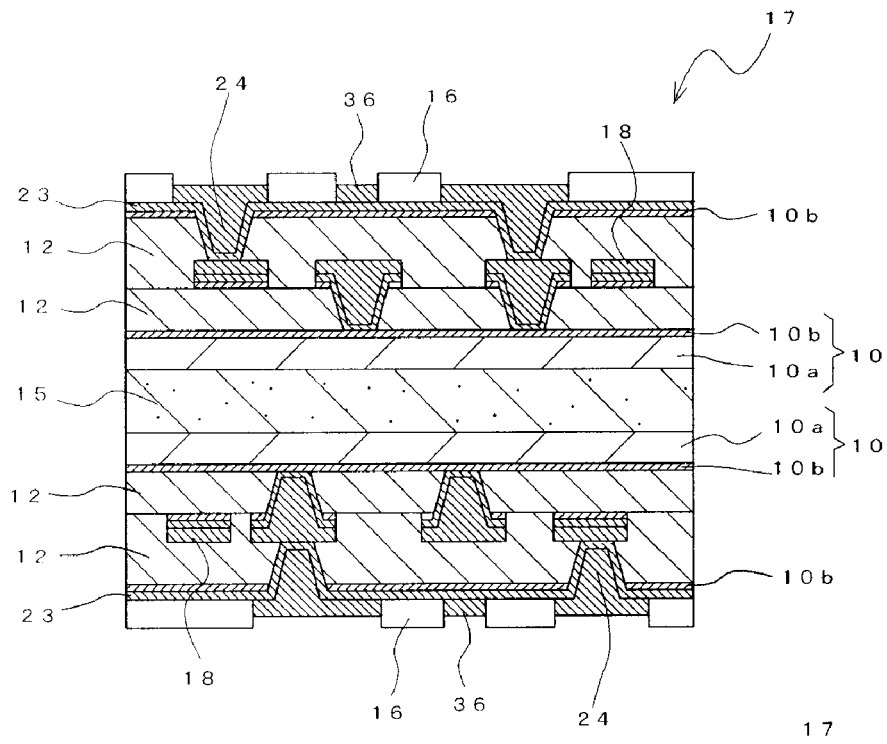
FIGS. 11A to 11B show process drawings explaining steps following the process drawing shown in FIG. 10B.
Figure 11B:
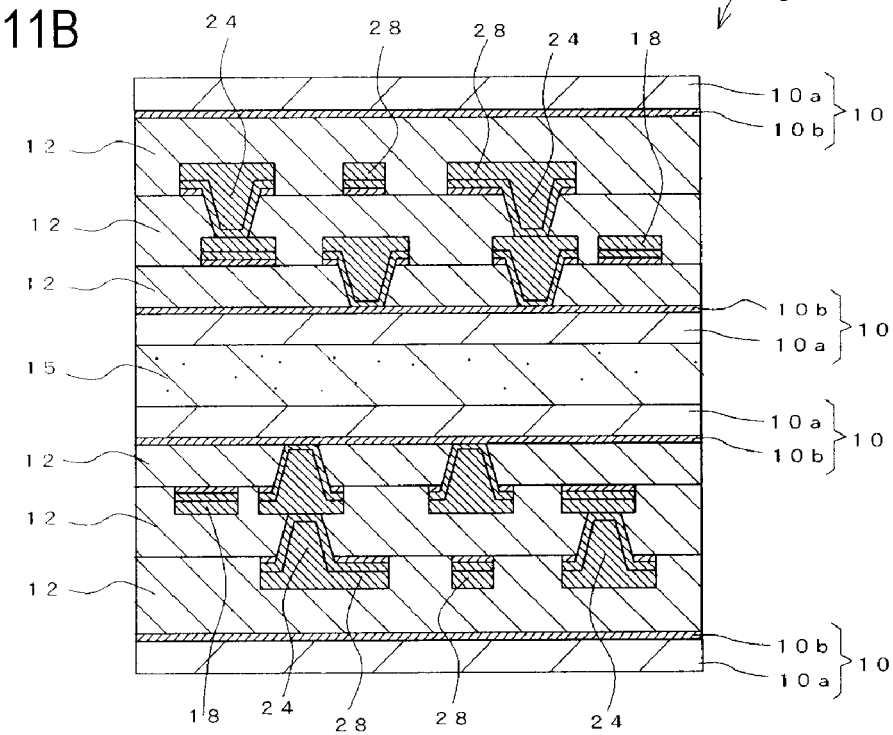

Also, as shown in FIG. 11B, the metallic foil with carrier 10 is stacked on the insulating layer 12 formed on both surface sides of the joined body 17 respectively. This metallic foil with carrier 10 is stacked such that the metallic foil 10b is opposed to the second conductor patterns 28, 28.

In the joined body 17 formed in this manner and shown in FIG. 11B, four metallic foils with carrier 10, 10, 10, 10 are provided.

Figure 12:
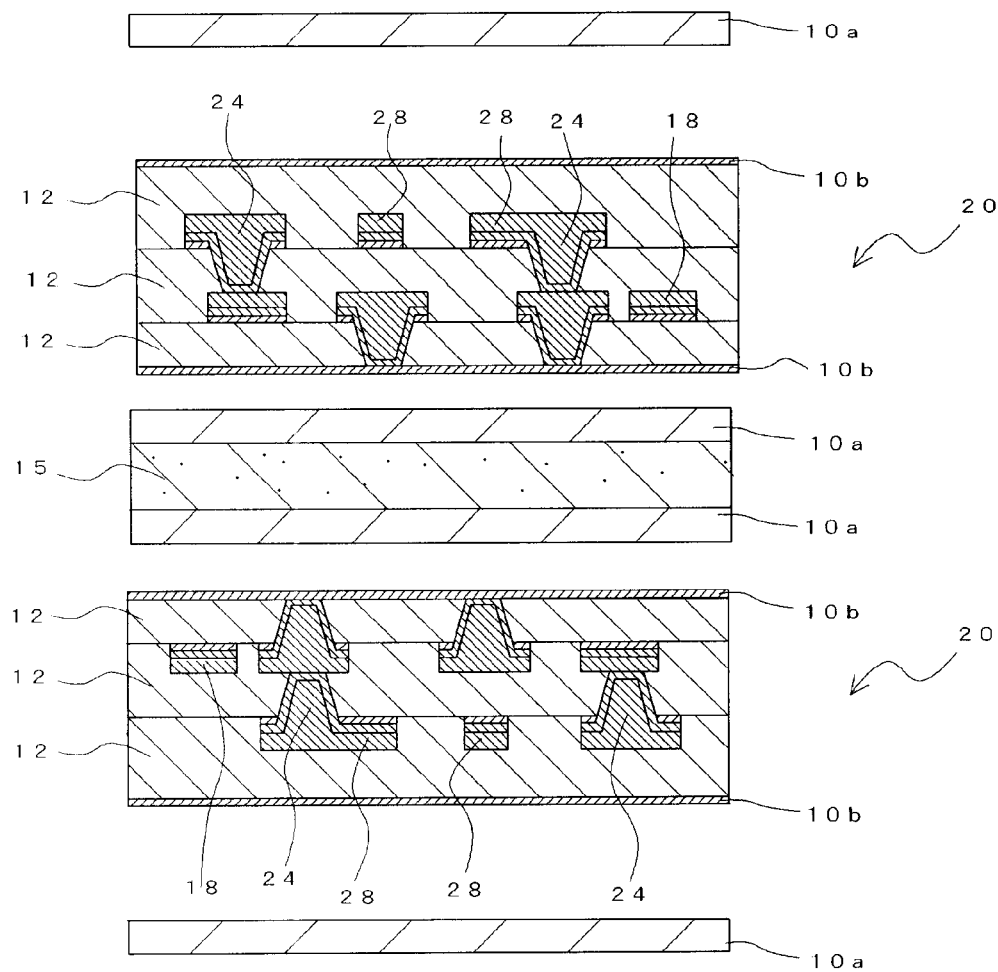
FIG. 12 shows a process drawing explaining steps following the process drawing shown in FIG. 11B.
Figure 14:
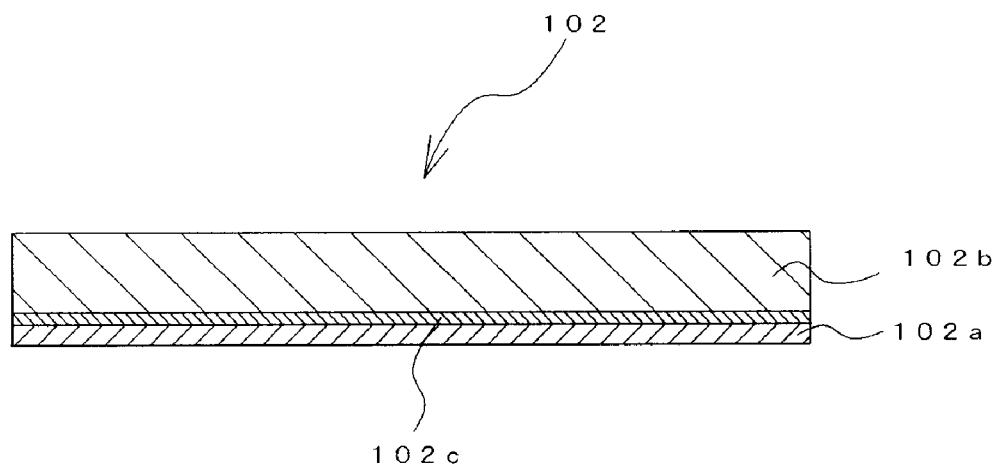
FIG. 14 shows a partial cross sectional view explaining a peelable metallic foil used in the related-art method of manufacturing a wiring substrate.

Then, as shown in FIG. 12, the metallic foils 10b of four metallic foils with carrier 10 of the joined body 17 are peeled respectively. Thus, the substrates 20, 20 in which the metallic foil 10b is provided on both surface sides respectively and also the first conductor patterns 18, 18 and the second conductor patterns 28, 28 are formed can be obtained.

In the substrates 20, 20 shown in FIG. 12, as shown in FIG. 9A, the via holes 22, 22, ..., from the bottom surfaces of which the second conductor pattern 28 is exposed respectively, are formed in the metallic foil 10b exposed to the second conductor pattern 28 side by the laser respectively.

Also, the thin metal film 23 is formed on the whole surface on both surfaces containing inner wall surfaces of the via holes 22, 22, ... of the substrate 20, from which the metallic foil 10b is exposed respectively, by the electroless plating or the vapor deposition.

Then, the dry films 16, 16 are patterned, and then the via-fill electroplating is applied by using the metallic foil 10b and the thin metal film 23 as a power feeding layer. Thus, the vias 24, 24 are formed by filling the plating metal in the via holes 22, 22, ..., and also the second conductor patterns 28, 28, ... each connected electrically to the first conductor pattern 18 via the via hole 22 respectively are formed on both surface sides of the substrate 20, so that the conductor patterns are formed as four layers in total.

In this manner, in the method of manufacturing the wiring substrate shown in FIG. 10A to FIG. 12, the wiring substrate in which the conductor patterns are stacked in an even number can be obtained.

In the above explanation, the via holes 22 are formed by the laser. But the via holes 22 can be formed by using the metallic foil 10b provided on the insulating layer 12 formed of a photosensitive resin. In this case, predetermined locations of the metallic foil 10b are removed by the laser, and then the via holes 22 can be formed by exposing/developing the insulating layer 12 formed of the exposed photosensitive resin while using the left metallic foil 10b as a mask.

Otherwise, the recess portions from the bottom surfaces of which the metallic foil 10b is exposed respectively are formed at predetermined locations in the resist that is coated on the metallic foil 10b, and then the exposed metallic foil 10b is removed by the etching to expose the insulating layer 12 formed of the exposed photosensitive resin. Then, then the via holes 22 can be formed by exposing/developing the exposed insulating layer 12.

Also, the via-fill method using the electroplating is explained when the vias 24 are formed by filing a metal in the via holes 22. But the vias 24 may be formed by filling the conductive paste in the via holes 22.

In this case, the conductor patterns may be formed after the vias 24 are formed.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of manufacturing a wiring substrate, comprising:
   preparing two stacked bodies, each having a first carrier, a first insulating layer, and a metal layer, the first carrier having a first carrier plate, a first peeling layer and a first metallic foil provided on one surface side of the first carrier plate via the first peeling layer, the metal layer being thicker than the first metallic foil of the first carrier and being provided on a metallic foil side of the first carrier via the first insulating layer;
   forming a joined body by jointing the carrier plates of each of said two stacked bodies to a joining layer such that the two stacked bodies are joined via the joining layer;
   forming first conductor patterns by patterning the metal layers positioned on both sides of the joined body respectively;
   providing second carriers, each of which has a second carrier plate, a second peeling layer, and a second metallic foil provided on one surface side of the second carrier plate via the second peeling layer, to the first conductor patterns formed on both sides of the joined body respectively via second insulating layers such that each of the first conductor patterns is opposed to the second metallic foil of one of the second carriers via one of the second insulating layers, the metal layer being thicker than the second metallic foil of the second carrier;

forming two substrates, each of which has a first side surface defined by one first metallic foil and a second side surface defined by one second metallic foil, by peeling the first carrier plates of the first carriers and the second carrier plates of the second carriers from the respective first and second peeling layers of the first and second carriers; and forming second conductor patterns which are connected electrically to the first conductor patterns via vias that pass through the first and second insulating layers respectively, from the first and second metallic foils formed on the first and second surface sides of the substrate; and wherein the joined body is formed after the two stacked bodies are prepared, the first conductor patterns are formed after the joined body is formed, the second carriers are provided after the first conductor patterns are formed, the two substrates are formed after the second carriers are provided, and the second conductor patterns are formed after the two substrates are formed.

2. A method of manufacturing a wiring substrate, according to claim 1, further comprising:

stacking sequentially a plurality of conductor patterns, which are connected electrically via vias that pass through third insulating layers, on the both surface sides of the substrate that contain the first conductor patterns therein to form the wiring substrate, in which the conductor patterns are formed as an odd-numbered layer.

3. A method of manufacturing a wiring substrate, according to claim 1, wherein the first and second metallic foils are copper foils, and the first and second carrier plates are copper plates.

4. A method of manufacturing a wiring substrate, according to claim 1, further comprising:

forming the vias by forming via holes in the first or second insulating layer by a laser and then filling the via holes with a plating metal.

5. A method of manufacturing a wiring substrate, according to claim 1, wherein the two substrates are formed such that each of the two substrates include one first insulating layer, one second insulating layer, and first conductor patterns, and said one first insulating layer, said one second insulating layer, and said first conductor patterns included in each of the substrates are disposed between the one first metallic foil and the one second metallic foil.

6. A method of manufacturing a wiring substrate, according to claim 5, wherein the two substrates are formed such that the first side surface and the second side surface of each of the substrates are opposite from one another.

7. A method of manufacturing a wiring substrate, according to claim 1, wherein the two substrates are formed such that the first side surface and the second side surface of each of the substrates are opposite from one another.

8. A method of manufacturing a wiring substrate, according to claim 1, wherein the joined body is formed such that the metal layers define opposite sides of the joined body.

* * * * *